United States Patent [19]

Link

[11] 4,441,119
[45] Apr. 3, 1984

[54] INTEGRATED CIRCUIT PACKAGE

[75] Inventor: Joseph Link, Carrollton, Tex.

[73] Assignee: Mostek Corporation, Carrollton, Tex.

[21] Appl. No.: 273,848

[22] PCT Filed: Jan. 15, 1981

[86] PCT No.: PCT/US81/00059
  § 371 Date: Jan. 15, 1981
  § 102(e) Date: Jan. 15, 1981

[87] PCT Pub. No.: WO82/02458
  PCT Pub. Date: Jul. 22, 1982

[51] Int. Cl.³ .................... H01L 23/02; H01L 39/02; H02G 13/08
[52] U.S. Cl. ........................... 357/74; 357/80; 174/52 S
[58] Field of Search ............... 357/74, 75; 361/414, 361/413, 421, 395; 339/17 F, 80, 17 CF; 174/52 S

[56] References Cited
U.S. PATENT DOCUMENTS

| | | | |
|---|---|---|---|
| 2,752,537 | 8/1952 | Wolfe | 361/414 |
| 3,484,533 | 12/1969 | Kauffman | 357/74 |
| 3,760,090 | 9/1973 | Fowler | 357/74 |
| 3,815,077 | 6/1974 | Anhalt et al. | 357/74 |
| 3,868,725 | 2/1975 | De Graaff | 357/74 X |
| 3,912,984 | 10/1975 | Lockhart, Jr. et al. | 357/74 |
| 4,080,027 | 3/1978 | Benasutti | 339/17 F |
| 4,224,637 | 9/1980 | Hargis | 357/74 |
| 4,342,069 | 7/1982 | Link | 361/414 X |

FOREIGN PATENT DOCUMENTS 55-61044 5/1980 Japan ................ 357/74 C

Primary Examiner—Martin H. Edlow
Assistant Examiner—J. L. Badgett

[57] ABSTRACT

An improved integrated circuit package (10) includes a cover (12), an intermediate subassembly (14) and a bottom subassembly (16). The intermediate and bottom subassemblies (14, 16) include lead frames (48, 22) respectively embedded therein, as well as openings which define a cavity for a semiconductor chip. The external lead pins (24) of the bottom subassembly (16) permit interconnection of the package with a circuit board or the like, while the external contacts (50) of the intermediate subassembly (14) cooperate with openings (62) in the cover to provide integral socket connections for other semiconductor packages or electrical components.

18 Claims, 4 Drawing Figures

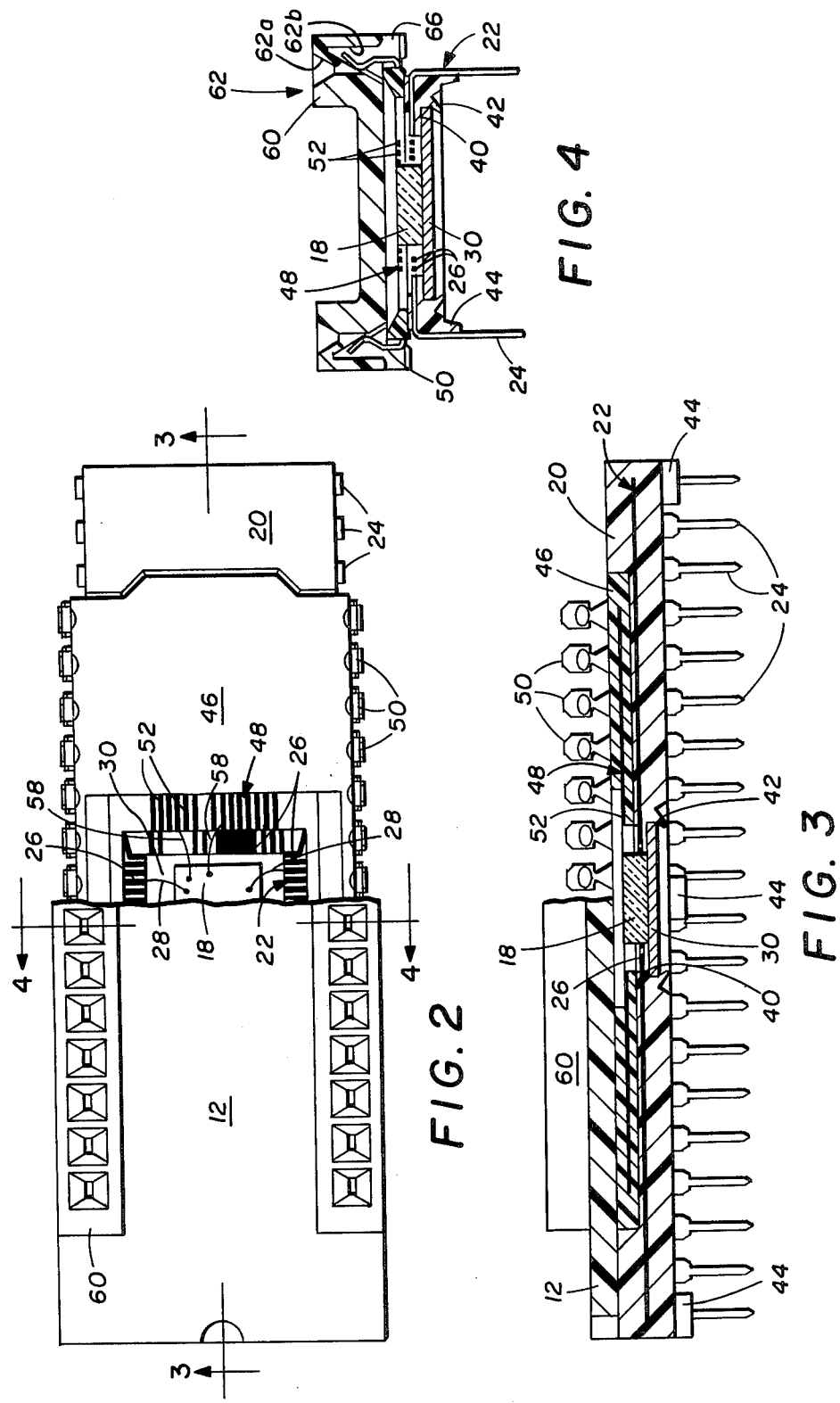

INTEGRATED CIRCUIT PACKAGE

TECHNICAL FIELD

The present invention relates generally to a package for a semiconductor device, and more particularly to an integrated circuit package having pin and socket connections integrally formed therein.

BACKGROUND ART

Integrated circuit (IC) chips are typically enclosed in packages to provide environmental and mechanical protection as well as electrical connection with a circuit board or other components. Such packages have generally included a body of nonconductive material with external lead pins by which the chip encased therein can be connected to a circuit board.

A substantial portion of the cost and size of a packaged chip is attributable to its package, and two important design criteria in addition to providing a reliable electrical connection are cost effectiveness and space efficiency. Further, it is generally desirable to design such packages for quick and easy disconnection to facilitate testing and replacement.

It will be appreciated that many electronic applications require functional cooperation between two or more IC chips. For example, microprocessor chips with the desired program logic contained therein are often utilized in conjunction with erasable programmable read only memory (EPROM) chips containing stored parameters which can be erased by ultraviolet light and reprogrammed with new parameters as necessary. A window must be provided in the package of the EPROM chip for transmission of the ultraviolet light. It is of course possible to combine the functions of a microprocessor and EPROM into a single monolithic integrated circuit and package, however, this has proven to be quite expensive due to the low chip per wafer yield associated with the manufacture of semiconductor devices and the relatively low production rates of such monolithic chips.

Although integrated circuit packages are not usually adapted for such, recently there have been efforts to adapt such packages for stacking to achieve greater circuit board density and space efficiency. For example, my copending application Ser. No. 053,879 discloses and claims an integrated semiconductor package capable of supporting separately packaged semiconductors. The supporting or base chip is interconnected electrically to lead pins and socket contacts by means of conductive circuitry compatible with other semiconductor packages. Even these packages, however, have tended to be expensive due to the additional components and manufacturing steps involved in their fabrication.

A need thus exists for an improved semiconductor package having pin and socket connections integrally formed therein for plug-in compatability with circuit boards and other semiconductors.

SUMMARY OF INVENTION

The present invention comprises an integrated circuit package which overcomes the foregoing and other difficulties associated with the prior art. In accordance with the invention, there is provided a semiconductor package comprised of a bottom pin subassembly, an intermediate socket subassembly and an upper socket cover. The pin subassembly includes a nonconductive body formed around a lead frame defining external lead pins and internal bonding fingers. The socket subassembly includes a nonconductive body formed around a lead frame defining external socket contacts and internal bonding fingers. The pin and socket subassemblies define a cavity for the semiconductor chip which in turn is wire bonded to the internal bonding fingers thereof. The external socket contacts of the socket subassembly are adapted to cooperate with openings in the cover to define integral socket connections for receiving lead pins from another semiconductor package or other electrical component. The external lead pins of the pin subassembly provide the connection by which the package can be plugged into a circuit board or the like.

BRIEF DESCRIPTION OF DRAWINGS

A better understanding of the invention can be had by reference to the following Detailed Description in conjunction with the accopanying Drawings, wherein:

FIG. 2 is a top view, partially cutaway, of the assembled package;

FIG. 3 is a longitudinal cross section of the assembled package; and

FIG. 4 is a lateral cross section of the assembled package.

DETAILED DESCRIPTION

Figure 1:
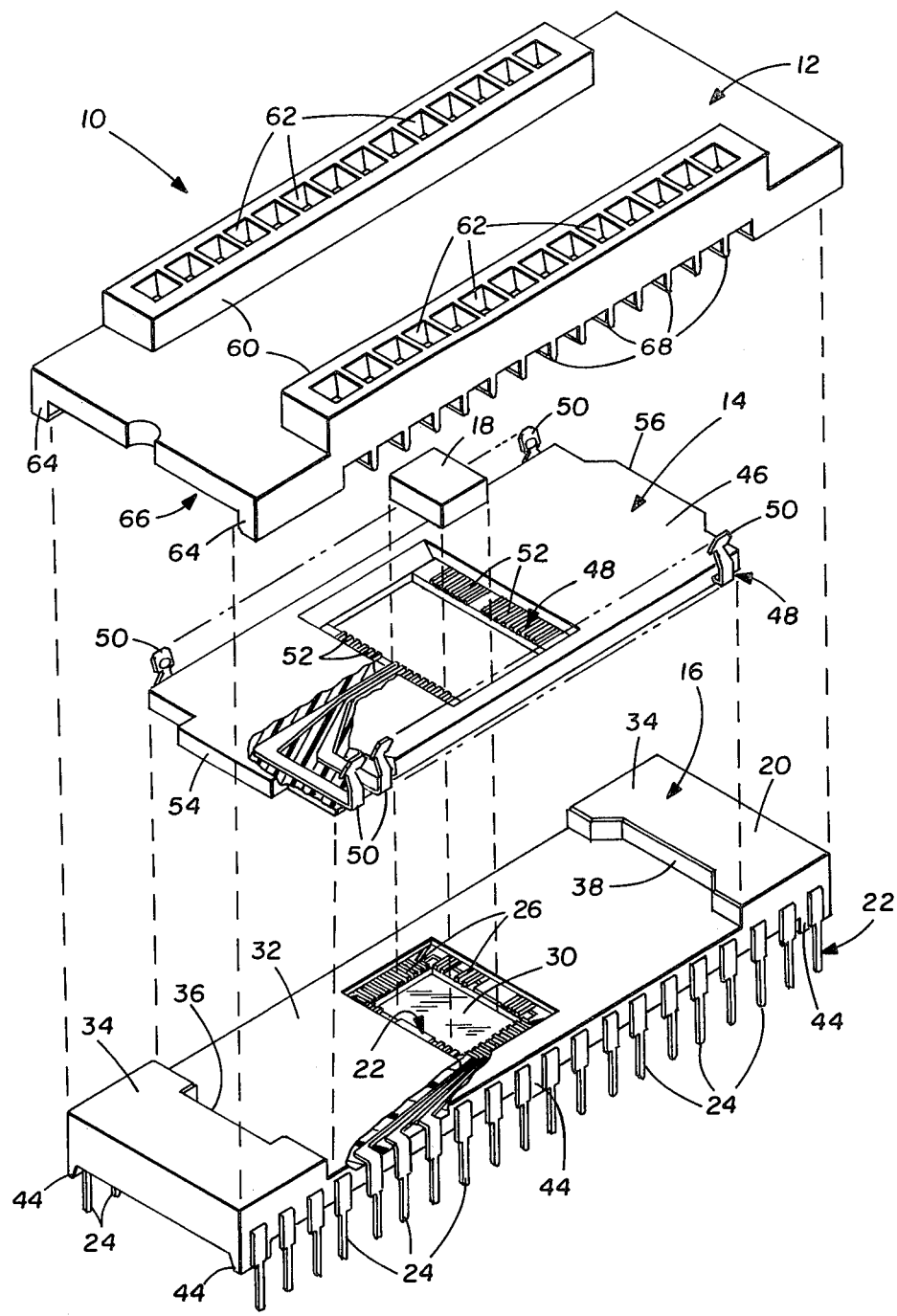
FIG. 1 is a perspective exploded view of the integrated circuit package of the invention.

Referring now to the Drawings, wherein like reference numerals designate corresponding elements throughout the views, and particularly referring to FIG. 1, there is shown the semiconductor package 10 incorporating the invention. Package 10 is comprised of a socket cover 12, a socket subassembly 14 and a pin subassembly 16 particularly adapted to be assembled into a package which provides integral pin and socket connections to facilitate connection of a semiconductor chip 18 with a circuit board as well as other semiconductor packages.

The pin subassembly 16 comprises an elongate, generally rectangular body 20 of nonconductive material formed around a lead frame 22 of conductive material. The lead frame 22 defines a plurality of external lead pins 24 extending downwardly in rows along opposite longitudinal sides of body 20. The pin leads 24 are connected with corresponding internal bonding fingers 26 of the lead frame 22 which terminate around a rectangular opening or recess formed in body 20 within which the semiconductor chip 18 is located. The pins 24 provide the electrical contacts by which package 10 is plugged into an underlying circuit board or another semiconductor package, while bonding fingers 26 provide the electrical path by which the pins are connected to chip 18 via wire bonds 28 as is best seen in FIGS. 2. For purposes of clarity, the wire bonds 28 have been omitted from FIGS. 1, 3 and 4.

The semiconductor chip 18 is attached by means of conventional die attachment techniques to a rectangular base plate 30 secured within the opening in body 20. The opening in body 20 is substantially centrally positioned within a flat recessed portion 32 located between two raised end portions 34. A notch 36 with substantially perpendicular corners is provided in the inside surface of one end portion 34 while a different notch 38 with inclined corners is provided in the opposite surfaces of the other end portion. Although notches 36 and 38 can be of similar configurations, the notches are preferably of different shapes to insure proper mating orientation and engagement with the socket subassembly 14.

In accordance with the preferred embodiment, body 20 is formed of plastic or other suitable nonconductive material to facilitate insertion molding around lead frame 22 using a suitable split mold and conventional molding techniques. For example, polyphenolene sulfide sold under the brand name RYTON by Phillips Chemical Company of Houston, Tex. offers temperature, shrink and moisture permeability properties which makes it suitable for use in forming body 20. Alloy 42, copper alloy or other suitable material can be utilized for the lead frame 22. Those skilled in the art will appreciate the fact that lead frames are produced in initially flat condition with the lead pins connected to opposite sides of a tie bar frame and with the bonding fingers all connected to a central pad. The body 20 is initially molded around the flat lead frame 22 such that the pad (not shown) interconnecting bonding fingers 26 is located within the central body opening.

After removal from the mold, the partial subassembly 16 is separated from the strip of lead frames by cutting off the lateral cross pieces (not shown) interconnecting the side tie bars (not shown) of the lead frame 22. The central pad interconnecting bonding fingers 26 is then punched out to clear the opening in body 20, and lead pins 24 are bent downwardly at substantially right angles as shown. The tie bars interconnecting each row of lead pins 24 are usually left in place to protect the pins during subsequent handling.

The partial pin subassembly 16 is then turned over and plate 30 is secured in place to close the bottom of the central opening in body 20 and to provide a base for chip 18. As is best seen in FIGS. 3 and 4, plate 30 rests on a flange 40 formed around the underside of the opening in body 20 separated from the bonding fingers 26 and in electrical isolation therewith. Plate 30 can be of nonconductive material, such as plastic, or conductive material such as aluminum, depending upon the requirements of die 18. Plate 30 can be secured to body 20 by any suitable fastening means. As illustrated, the plate 30 is secured in place by integral projections 42 of body 20 bent inwardly.

Although pin subassembly 16 is shown with a separate base plate 30 secured in an opening formed in body 20, it will be understood that the subassembly can be formed with a central recess in portion 32 such that the base plate is integral with the body. The internal bonding fingers 26 of lead frame 22 would therefore terminate around a recess or cavity closed at the bottom.

The pin subassembly 16 is shown with a lead frame 22 having forty lead pins 24 and corresponding bonding fingers 26, however, this number is not critical to the invention and it will be understood that any suitable number of lead pins and bonding fingers can be utilized in accordance with the particular application. If desired, a plurality of standoff feet 44 can be integrally formed into the bottom surface of body 20 for spacing purposes.

The socket subassembly 14 is comprised of a plate 46 formed around another lead frame 48 defining a plurality of external socket contacts 50 and corresponding bonding fingers 52. Plate 46 is of flat, generally rectangular shape and is adapted to fit into the recessed portion 32 of pin subassembly 16. Complementary projections 54 and 56 are preferably provided on opposite ends of plate 46 for receipt in notches 36 and 38, respectively, of subassembly 16. The use of projections 54 and 56 is not critical to practice of the invention; however, but the use of such projections, and particularly projections of different configurations, is desired to facilitate proper mating of subassemblies 14 and 16. In the preferred embodiment, projection 54 is generally rectangular with perpendicular corners while projection 56 has inclined corners.

Bonding fingers 52 of lead frame 48 terminate around an opening in plate 46 which is positioned to register with the opening formed in subassembly 16. The external contacts 50 of lead frame 48 are formed to cooperate with cover 12 and define integral socket connections by which other semiconductor packages, connectors or other electronic components can be plugged into package 10 as will be explained more fully hereinafter.

The socket subassembly 14 is formed of similar materials and in similar fashion to subassembly 16. In the preferred embodiment, plastic is molded around the lead frame 48, which is flat initially, within a split mold by means of conventional insertion molding techniques. Suitable nonconductive material such as polyphenolene sulfide like that mentioned above for body 20 in subassembly 16, can be used for plate 46. After removal from the mold, the lateral cross pieces between the partial subassemblies 14 in the strip of lead frames are cut to separate the subassembly from others in the strip. The central pad interconnecting bonding fingers 52 is then punched or cut out to clear the opening in plate 46. The contacts 50 are then bent upwardly and the side tie bars interconnecting the contacts are usually left in place for protection during subsequent handling.

The socket subassembly 14 is shown with twenty eight external socket contacts 50 and corresponding fingers 52, however, it will be appreciated that this number is not critical to the invention and that any suitable number of contacts and fingers can be utilized dependent upon the particular application. In addition, while bonding fingers 52 are shown only on opposite ends of the opening in plate 46, the bonding fingers can be arranged to extend into the opening in any arrangement desired. If desired, ribs (not shown) can be provided on adjacent mating surfaces of plate 46 and body 20 for ultrasonic tack welding purposes.

After formation, the socket subassembly 14 and pin subassembly 16 are interconnected followed by attachment of the semiconductor chip 18 and connection thereof to the bonding fingers of the two subassemblies. Plate 46 of subassembly 14 can be secured to body 20 of subassembly 16 by any suitable means including ultrasonic welding, staking, adhesives, etc. Upon connection, the openings in subassemblies 14 and 16 define a cavity for receiving chip 18. Chip 18 is then secured to plate 30 by means of conventional die attachment techniques. The contact pads of semiconductor chip 18 are then connected to bonding fingers 26 and 52 by means of wires 28 and 58, respectively, in accordance with well known wire bonding techniques to electrically interconnect the chip with pins 24 and contacts 50. If desired, the cavity defined by plate 46 and body 20 can then be filled with suitable potting material to protect chip 18 and wire bonds 28 and 58. The tie bars interconnecting contacts 50 of socket subassembly 14 are then cut away so that the contacts can be formed into general S-shapes before cover 12 is secured thereto.

As illustrated, package 10 is shown electrically connected directly to bonding fingers 26 and 52 by wires 28 and 58 respectively. This has been found to be the most practical, however, other approaches can be taken. For example, bonding fingers 26 and 52 can be wired together or formed to make mechanical contact upon engagement of subassemblies 14 and 20. The manner in which chip 18 is electrically connected to lead frames 22 and 48 is not critical to practice of the invention.

Cover 12 of package 10 comprises a generally rectangular body of nonconductive material having socket openings integrally formed therein for cooperation with contacts 50 to define socket connections. In the preferred embodiment, cover 12 is also formed of plastic material such as polyphenolene sulfide. Extensions 60 are provided on the upper surface of cover 12 along opposite longitudinal sides thereof. A plurality of socket openings 62 are formed in each extension 60 with one opening being provided for each contact 50 on socket subassembly 14. As is best seen in FIG. 4, each socket opening 62 is comprised of an upper portion 62a for receiving the lead pins (not shown) of another package, connector, or other electrical components, and a lower portion 62b for receiving an S-shaped contact 50 on subassembly 14. A flange or skirt 64 is provided along each longitudinal side of the bottom of cover 12 to provide an overlap with the socket subassembly 14 when the recessed portion 66 of the cover is placed over plate 46 to close the chip cavity. If desired, the skirts 64 can be continuous along their lengths; however, as illustrated, the skirts are cut away and dividers 68 and provided between each socket opening 62 to facilitate side access to contacts 50 for testing purposes, etc. Cover 12 can be secured to plate 46 and thus to body 20 by any suitable connection means including ultrasonic welding, staking or adhesives.

From the foregoing, it will be thus be apparent that the present invention comprises a new and improved semiconductor package having several advantages over the prior art. Significant advantages include the fact that molded plastic and prefabricated lead frames are utilized to form a package having integral socket connections thereon which eliminate the need for separate interconnects. The invention provides a less expensive alternative to the semiconductor packages of the prior art. Other advantages will be evident to those skilled in the art.

Although particular embodiments of the invention have been illustrated in the accompanying drawings and described in the foregoing Detailed Description, it will be understood that the invention is not limited to the embodiments disclosed, but is intended to embrace any alternatives, equivalents, modifications and rearrangements of elements falling within the scope of the invention as defined by the following claims.

I claim:

1. A semiconductor package, comprising:
   a bottom member;
   a first lead frame encased in said bottom member;
   said first lead frame including internal bonding fingers terminating within an opening extending at least partially into said bottom member, and corresponding external lead pins;
   an intermediate member secured to said bottom member;
   a second lead frame encased in said intermediate member, said second lead frame including internal bonding fingers terminating within an opening in said intermediate member and corresponding external contacts;
   the openings in said bottom and intermediate members defining a cavity for receiving a semiconductor chip; and
   a cover member secured to said intermediate member, said cover member including predetermined openings therein for cooperating with the contacts of said second lead frame to define socket connections.

2. The semiconductor package of claim 1, wherein said bottom, intermediate and cover members are formed of plastic.

3. The semiconductor package of claim 1, wherein said first and second lead frames are formed of metal.

4. The semiconductor package of claim 1, wherein said bottom member includes raised end portions defining a recess for receiving said intermediate member, and wherein said bottom and intermediate members include complementary notch and groove structure to facilitate proper mating engagement.

5. The semiconductor package of claim 1, wherein the contacts of said second lead frame are generally S-shaped.

6. The semiconductor package of claim 1, wherein said cover member includes downwardly extending side portions defining a recess within which said intermediate member is received.

7. The semiconductor package of claim 1, wherein the opening in said bottom member extends therethrough and further including:
   a plate secured in the opening in said bottom member for supporting the semiconductor chip.

8. The semiconductor package of claim 1, wherein the opening in said bottom member extends partially thereinto such that an integral portion of said bottom member forms a support for the semiconductor chip.

9. A semiconductor package, which comprises:
   a bottom member;
   a first lead frame embedded in said bottom member;
   said first lead frame including bonding fingers terminating within an internal opening extending at least partially into said bottom member, and corresponding lead pins terminating externally of said bottom member;
   an intermediate member secured to said bottom member;
   a second lead frame embedded in said intermediate member, said second lead frame including bonding fingers terminating within an internal opening in said intermediate member and corresponding external contacts terminating externally of said intermediate member;
   the openings in said bottom and intermediate members defining a cavity;
   a plate secured within the opening in said bottom member;
   a semiconductor chip attached to said plate; and
   a cover member secured to said intermediate member, said cover member including predetermined openings for cooperating with the contacts of said lead frame to define integral socket connections.

10. The semiconductor package of claim 9, wherein said bottom, intermediate and cover members are formed of plastic.

11. The semiconductor package of claim 9, wherein said first and second lead frames are formed of metal.

12. The semiconductor package of claim 9, wherein said bottom member includes raised end portions defining a recess for receiving said intermediate member, and wherein said bottom and intermediate members include complementary notch and groove structure to facilitate proper mating engagement.

13. The semiconductor package of claim 9, wherein the contacts of said second lead frame are generally S-shaped.

14. The semiconductor package of claim 9, further including:
means for electrically interconnecting said chip with the boding fingers of at least one of said first and second lead frames.

15. The semiconductor package of claim 9, wherein said cover member includes downward side portions defining a recess for receiving said intermediate member.

16. The semiconductor package of claim 9, wherein the opening in said bottom member extends partially thereinto and said plate comprises an integral portion of said bottom member.

17. A package for an integrated circuit chip, comprising:
structure defining a first lead frame with plural bonding fingers and lead pins;
a first member formed around said first lead frame such that the bonding fingers thereof terminate internally within an opening in said first member and the lead pins terminate externally thereof;
structure defining a second lead frame with plural bonding fingers and corresponding contacts;
a second member formed around said second lead frame such that the bonding fingers thereof terminate internally within an opening in said second member and the contacts terminate externally thereof;
said first and second members being secured together such that the openings therein cooperate to define a cavity for receiving the integrated circuit chip;
means secured within the opening in said first member for closing one end of the cavity and providing a base for the integrated circuit chip;
the lead pins on the first lead frame extending downward from the first member with the contacts of said second lead frame extending upward from the second member; and
a third member interconnected with said second member, said third member including predetermined openings therein adapted for receiving the upward contacts of said second lead frame and cooperating therewith to define plural integrated socket connections.

18. A package for an integrated circuit chip, comprising:
structure defining a first lead frame with plural bonding fingers and lead pins;
a first member formed around said first lead frame such that the bonding fingers thereof terminate internally within a recess in said first member and the lead pins terminate externally thereof;
structure defining a second lead frame with plural bonding fingers and corresponding contacts;
a second member formed around said second lead frame such that the bonding fingers thereof terminate internally within an opening in said second member and the contacts terminate externally thereof;
said first and second members being secured together such that the openings therein cooperate to define a cavity for receiving the integrated circuit chip;
an integral portion of said first member extending across the opening therein for closing one end of the cavity and providing a base for the integrated circuit chip;
the lead pins on the first lead frame extending downward from the first member with the contacts of said second lead frame extending upward from the second member; and
a third member interconnected with said second member, said third member including predetermined openings therein adapted for receiving the upward contacts of said second lead frame and cooperating therewith to define plural integrated socket connections.

* * * * *